United States Patent [19]

Peterson

[11] Patent Number: 4,942,398
[45] Date of Patent: Jul. 17, 1990

[54] DIGITAL SIGNAL TRANSLATOR HAVING COMPENSATION FOR P-CHANNEL AND N-CHANNEL THRESHOLD VOLTAGE SHIFTS

[75] Inventor: LuVerne R. Peterson, San Diego, Calif.

[73] Assignee: Unisys Corporation, Blue Bell, Pa.

[21] Appl. No.: 326,596

[22] Filed: Mar. 21, 1989

[51] Int. Cl.[5] .............................................. H03M 5/04
[52] U.S. Cl. .................................... 341/118; 307/443; 307/475
[58] Field of Search ....................... 341/50, 51, 56, 63, 341/118, 132; 307/296.6, 296.7, 310, 246, 443, 446, 451, 455, 473, 469, 475, 497

[56] References Cited

U.S. PATENT DOCUMENTS 4,656,372 4/1987 Sani et al. ............................ 307/475
4,849,660 7/1989 Hayashi et al. ...................... 307/475

*Primary Examiner*—William M. Shoop, Jr.
*Assistant Examiner*—Brian K. Young
*Attorney, Agent, or Firm*—Charles J. Fassbender; Robert S. Bramson

[57] ABSTRACT

A digital translator, on a semiconductor chip that contains N-channel transistors and P-channel transistors which have threshold voltages that vary about respective nominal values, includes an input/output module which is made of the transistors and which receives a digital input signal at two voltage levels and in response generates a digital output signal at two different voltage levels. To compensate for the threshold variations and thereby stabilize the voltage levels of the output signal, the translator also includes a voltage generator which produces a reference voltage for the input/output module. This generator is made of the N-channel transistors and the P-channel transistors, and it varies the reference voltage in proportion to the threshold voltage of the N-channel transistors regardless of how the threshold voltage of the P-channel transistors varies; and, the input/output module includes one of the N-channel transistors which receives the reference voltage and produces the output signal by conducting in proportion to the reference voltage only when the input signal is at one of its two voltage levels.

12 Claims, 4 Drawing Sheets

| P | N | 11' | 14' | VR |
|---|---|-----|-----|------|
| T | T | T   | T   | T    |
| T | L | Lg  | Sm  | Low  |
| T | H | Sm  | Lg  | High |
| L | T | Sm  | Sm  | T    |
| H | T | Lg  | Lg  | T    |
| L | H | Sm  | T   | High |
| H | L | Lg  | T   | Low  |
| L | L | T   | Lg  | Low  |
| H | H | T   | Lg  | High |

| P | N | 11' | 14' | $V_R$ |
|---|---|-----|-----|-------|
| T | T | T | T | T |
| T | L | Lg | T | Low |
| T | H | Sm | T | High |
| L | T | Sm | Sm | T |
| H | T | Lg | Lg | T |
| L | H | Sm | T | High |
| H | L | Lg | T | Low |
| L | L | T | Sm | Low |
| H | H | T | Lg | High |

DIGITAL SIGNAL TRANSLATOR HAVING COMPENSATION FOR P-CHANNEL AND N-CHANNEL THRESHOLD VOLTAGE SHIFTS

BACKGROUND OF THE INVENTION

This invention relates to digital signal translators which convert digital signals from one pair of voltage levels to another; and in particular, it relates to circuits for use in such translators which make their operation insensitive to threshold voltage variations in their transistors.

In the prior art, digital signal translators exist which convert digital input signals that have CMOS voltage levels into digital output signals that have ECL voltage levels. CMOS voltage levels nominally are zero volts and +5 volts; and the corresponding ECL voltage levels nominally are −0.9 volts and −1.8 volts. However, the prior art translators are deficient in that the ECL voltage levels of their output signals vary too widely with changes in the threshold voltage of the transistors from which the translators are made. When the threshold voltage variations cause the two voltage levels of the output signal to move closer together, then the two levels are less distinguishable from each other. Conversely, when the two voltage levels of the output signal move farther apart, then switching noise is increased as the signal changes from one level to the other.

This problem cannot be overcome simply by making the threshold voltage of the transistors fixed. That is because the threshold voltage shifts are caused by unavoidable variations in the processes which make the transistors. For example, variations in the process step which etches the transistor's gate will change the gate length. An etch which yields a nominal gate length will tend to produce a transistor with a nominal threshold voltage; an etch which yields a longer gate will tend to increase the threshold voltage; and an etch which yields a shorter gate will tend to decrease the threshold voltage. These variations will affect the threshold of both P-channel transistors and N-channel transistors since their gates are etched with the same step.

Other processing variations can affect the threshold of N-channel transistors and the threshold of P-channel transistors independently. For example, the source and drain of the N-channel transistors are implanted separately from the source and drain of the P-channel transistors since they require different type dopants. And, an implant dosage which is larger than nominal will shorten the effective channel length and tend to produce a lower threshold voltage; whereas an implant dosage which is smaller than nominal will increase the effective channel length and tend to raise the threshold voltage. Further, N-channel transistors and/or P-channel transistors sometimes have their channel implanted separately to shift their threshold up or down, and the dosage of such channel implants has an unavoidable tolerance which varies above and below a nominal value.

Accordingly, a primary object of the invention is to provide a circuit, for use with digital signal translators, by which the above described problems are avoided.

BRIEF SUMMARY OF THE INVENTION

The above object is achieved by a digital translator on a semiconductor chip that contains N-channel transistors and P-channel transistors which have threshold voltages that vary about respective nominal values. This translator includes an input/output module which is made of these transistors and which receives a digital input signal at two voltage levels and in response generates a digital output signal at two different voltage levels. Further, to compensate for the threshold variations of the transistors, the translator also includes:

a voltage generator which produces a reference voltage and sends it to the input/output module;

the generator including a circuit of the N-channel transistors and the P-channel transistors which varies the reference voltage in proportion to the threshold voltage of the N-channel transistors regardless of how the threshold voltage of the P-channel transistors varies; and, the input/output module includes one of the N-channel transistors which receives the reference voltage and produces the output signal by conducting in proportion to the reference voltage only when the input signal is at one of its two voltage levels.

In this translator, the variable reference voltage causes the input/output module to compensate for threshold shifts in its N-channel transistor and thereby stabilize the voltage levels of the output signal.

BRIEF DESCRIPTION OF THE DRAWINGS

Various embodiments of the invention are described in the Detailed Description in conjunction with the accompanying drawings wherein.

DETAILED DESCRIPTION OF THE INVENTION

Figure 1:
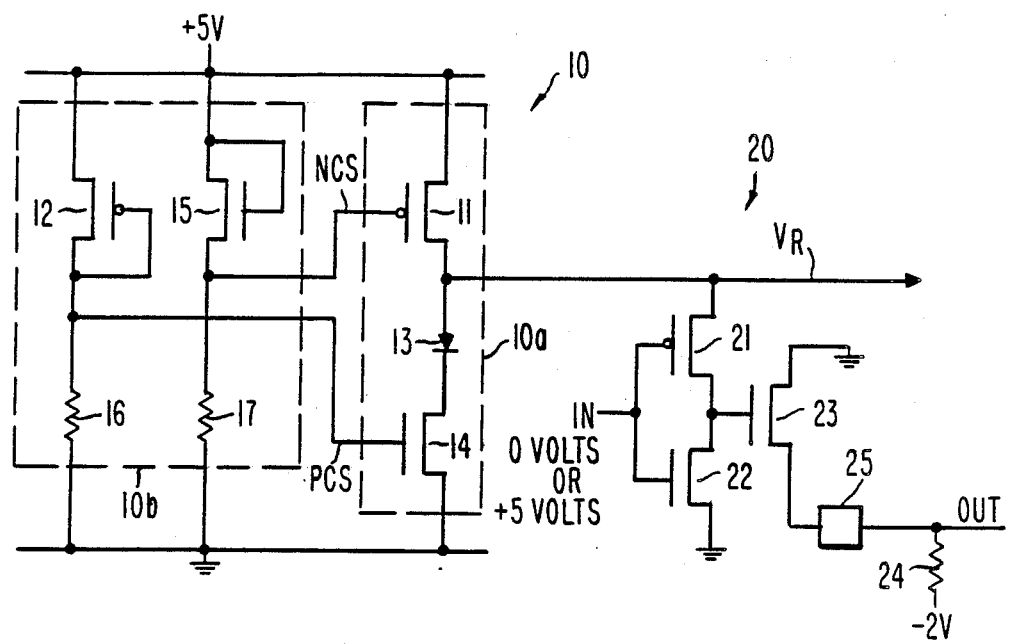
FIG. 1 is a detailed circuit diagram of one preferred embodiment of the invention.

Referring now to FIG. 1, the details of one preferred embodiment of a digital signal translator will be described. This translator consists of a variable reference voltage generator 10 which operates in conjunction with an input/output module 20. Generator 10 consists of P-channel transistors 11 and 12, a diode 13, N-channel transistors 14 and 15, and resistors 16 and 17. Module 20 consists of P-channel transistor 21, and N-channel transistors 22 and 23, a resistor 24, and an input/output pad 25. All of these components are integrated on a semiconductor chip (not shown), and they are interconnected as illustrated.

In operation, module 20 receives an input signal IN which has nominal voltage levels of zero and +5 volts, and in response it produces an output signal OUT which has nominal voltage levels of −0.9 and −1.8 volts respectively. When signal IN is at +5 volts, transistor 21 turns completely off while transistor 22 turns completely on. Thus, transistor 22 transfers zero volts to the gate of transistor 23, which turns transistor 23 almost completely off and forces the output signal OUT to −1.8 volts. Conversely, when the input signal IN is at zero volts, transistor 22 turns completely off while transistor 21 turns completely on. Thus, transistor 21 transfers the reference voltage $V_R$ to the gate of transistor 23, and that causes transistor 23 to conduct by an amount which varies in proportion to the magnitude of the reference voltage.

In the FIG. 1 circuit, the threshold voltage of all of the N-channel transistors varies about a positive nominal value, and the threshold voltage of all of the P-channel transistors varies about a negative nominal value. These variances are caused by tolerances which inherently occur in the process which makes the transistors, as was explained in the Background. Suppose now that the input signal IN is at zero volts, that the reference voltage $V_R$ is fixed at +5 volts, and that the threshold voltage of transistor 23 is above nominal. In that case, the source-drain resistance of transistor 23 will be larger than nominal, and so the IR drop across it will lower the output voltage below nominal. Conversely, if the threshold voltage of transistor 23 is below nominal, then the source-drain resistance of transistor 23 will be smaller than nominal which will raise the output voltage above nominal.

As the voltage level of the output signal rises above nominal, the difference between the two levels of the output signal increases; and that increases the noise which the output signal generates when it switches. On the other hand, as the voltage level of the output signal drops below nominal, then the difference between the two levels of the output signal decreases, which makes them less distinguishable from one another.

To compensate for the above, the reference voltage $V_R$ is not fixed. Instead, generator 10 varies the voltage $V_R$ such that its magnitude is in proportion to the threshold voltage of the N-channel transistors regardless of how the threshold voltage of the P-channel transistors varies. This has the effect of keeping the voltage level of the output signal OUT near its nominal value. For example, if transistor 23 has a high threshold, transistor 23 will conduct less which will lower the output signal; but a higher voltage $V_R$ on the gate of transistor 23 will tend to bring the conduction of transistor 23 back to nominal, which will return the output signal to nominal.

To produce the variable voltage $V_R$, the components of the generator 10 are arranged as two circuits 10a and 10b. Circuit 10a consists of components 11, 13, and 14; and it forms a voltage divider circuit. Circuit 10b consists of components 12, 15, 16 and 17; and it forms a control circuit which adjusts the source-drain resistances of the transistors 11 and 14 in the voltage divider. These circuits 10a and 10b are powered between two voltage buses which respectively carry the same voltage levels as the input signal, so special supply voltages are not needed on the chip.

Control circuit 10b produces a P-channel control signal PCS and an N-channel control signal NCS. Signal PCS increases as the threshold voltage of the P-channel transistor 12 decreases in magnitude, and signal NCS increases as the threshold voltage of the N-channel transistor 15 decreases in magnitude. Control signals PCS and NCS are respectively applied to the gate of the N-channel transistor 14 and the P-channel transistor 11 in order to control the source-drain resistance of those transistors.

Figure 2:
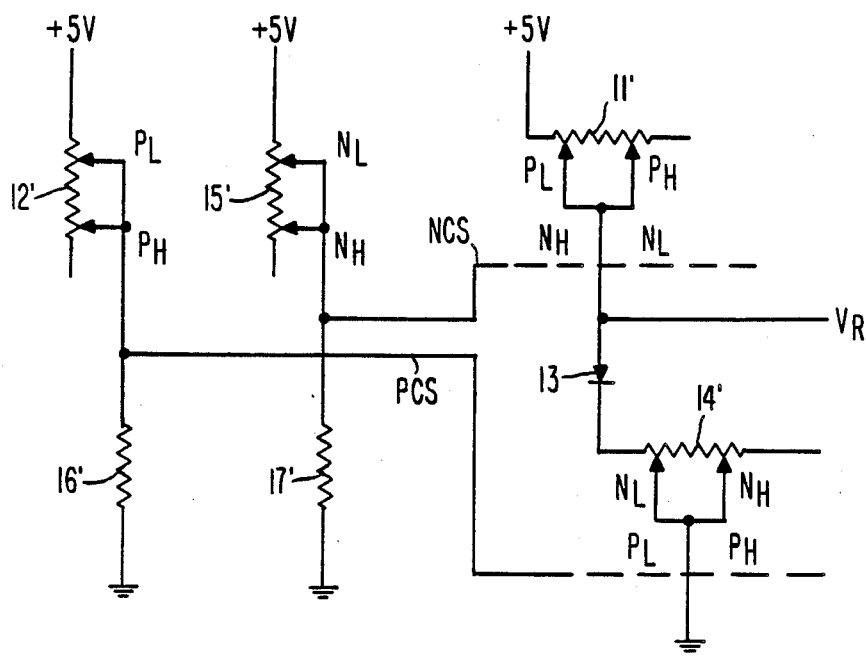
FIG. 2 is an equivalent circuit of the FIG. 1 embodiment which helps explain its operation.

How the control signals PCS and NCS affect the reference voltage $V_R$ can be seen from inspection of FIG. 2, which is an equivalent circuit of the reference voltage generator 10. In FIG. 2, each of the transistors 11, 12, 14 and 15 is illustrated as a variable source-drain resistor having the same reference numeral, with a prime mark, as the corresponding transistor. These variable resistors have a tap which is at a high resistance position or a low resistance position depending on the threshold of the corresponding transistor.

Symbol $P_L$ in FIG. 2 indicates the position of the taps when the threshold of the P-channel transistors is low in magnitude, and symbol $P_H$ indicates the position of the taps when the threshold of the P-channel transistors is high in magnitude. Similarly, symbol $N_L$ indicates the position of the taps when the threshold of the N-channel transistors is low, and symbol $N_H$ indicates the position of the taps when the threshold of the N-channel transistors is high.

Also in FIG. 2, the tap of the variable resistor 11' is crossed by a dashed line which represents the gate of the corresponding transistor. That line carries the N-channel control signal, and the symbols $N_H$ and $N_L$ respectively indicate where the N-channel control signal positions the tap when the threshold of the N-channel transistors is high and low. For example, if the N-channel transistor 15 has a high threshold, the N-channel control signal will be low, which will tend to reduce the source-drain resistance of the P-channel transistor 11. Conversely, if the N-channel transistor 15 has a low threshold, the N-channel control signal will be high, which will tend to increase the resistance through transistor 11. In like fashion, the tap of resistor 14' is crossed by a dashed line which represents the gate of the corresponding transistor; that line carries the P-channel control signal; and the symbols $P_L$ and $P_H$ respectively indicate the position of the tap when the threshold of the P-channel transistors is high and low in magnitude.

Figures 3, 4:
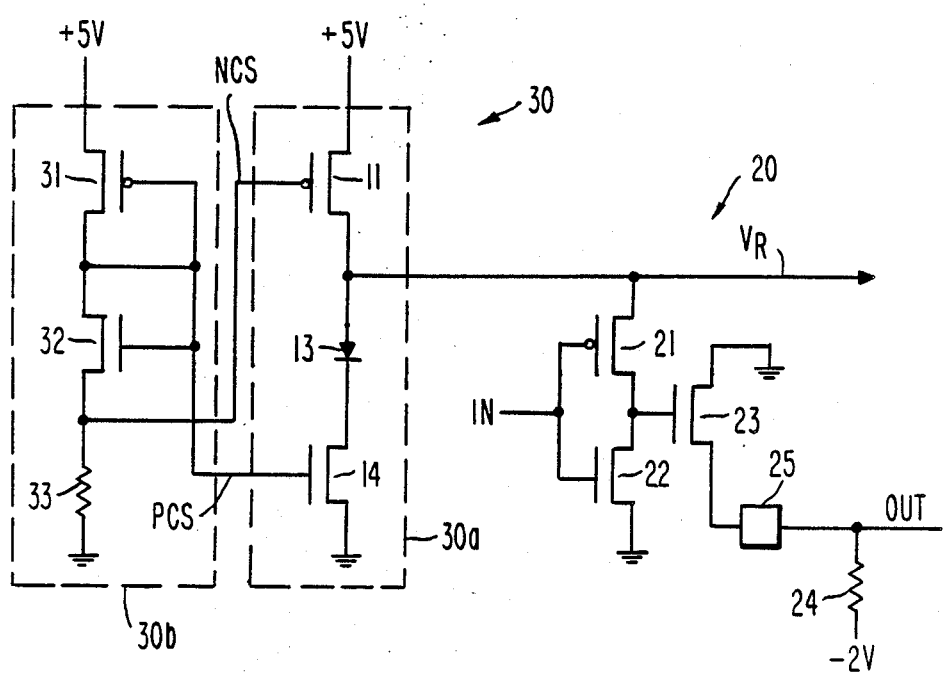
FIG. 3 is a table which lists how the components of the FIG. 2 circuit vary and the resulting reference voltage that is generated.
FIG. 4 is a detailed circuit diagram of another preferred embodiment of the invention.

From the above it can be seen that different reference voltages will be generated by the FIG. 2 circuit depending upon the particular threshold voltages of the P-channel and N-channel transistors. And, a table in FIG. 3 lists various combinations of those threshold voltages and the resulting reference voltage. In FIG. 3, under the column labeled "P", the symbols T, L, and H respectively indicate a typical threshold, a low magnitude threshold, and a high magnitude threshold for the P-channel transistors. By definition, the threshold of the transistors on one-half of the chips in a mass production environment will lie above the "typical" threshold, and the threshold of the transistors on the other half of the chips will lie below the typical threshold. Similarly, under the column labeled "N", the symbols T, L, and H respectively indicate a typical threshold, a low threshold, and a high threshold for the N-channel transistors. Two other columns labeled 11' and 14' respectively indicate the resistance of the variable resistors 11' and 14' under the conditions where the threshold voltages of the P-channel and N-channel transistors are as indicated by the columns P and N. Another column, labeled $V_R$, gives the resulting reference voltage.

For example, the topmost row in the FIG. 3 table contains all T's. This indicates that when the threshold voltages of the P-channel transistors and the N-channel transistors are both typical, resistances 11' and 14' will also be typical and so the resulting reference voltage will be typical. Those typical values can be compared to the values which are in the remaining rows. In the second row, for example, the threshold voltage of the P-channel transistors is typical while the threshold voltage of the N-channel transistors is low. As a result, resistance 11' gets large while resistance 14' gets small. This in turn lowers the reference voltage.

As another example, in the third row of the FIG. 3 table, the threshold voltage of the P-channel transistors is typical while the threshold voltage of the N-channel transistors is high. That reduces resistance 11' and increases the resistance 14', which in turn increases the reference voltage. Similar examinations can be made of all of the rows in the FIG. 3 table.

Note that in some cases, the threshold voltages for the P-channel transistors and the N-channel transistors can affect the resistances 11' and 14' in opposite ways. For example, a high magnitude P-channel threshold will tend to increase the resistances 11' while a high N-channel threshold will tend to decrease the resistance 11'. These two effects tend to counteract each other which results in making the resistance 11' typical.

A comparison of all of the entries in the N, P and $V_R$ columns shows that the reference voltage $V_R$ does in fact vary in proportion to the threshold voltage of the N-channel transistors regardless of how the threshold varies in the P-channel transistors. Thus, the reference voltage $V_R$ will stabilize the output signal OUT of the voltage translator 20 as was explained above.

Figures 5, 6:
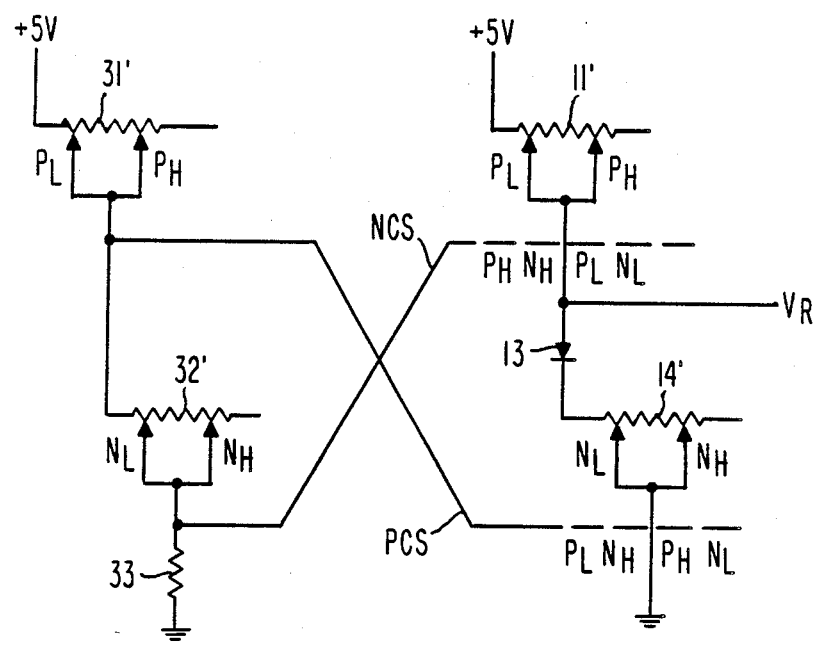
FIG. 5 is an equivalent circuit of the FIG. 4 embodiment which helps explain its operation.
FIG. 6 is a table which lists how the components of the FIG. 4 circuit vary and the resulting reference voltage.

Turning now to FIGS. 4, 5 and 6, the details of a second embodiment for the reference voltage generator will be described. This second embodiment is indicated by reference numeral 30, and it is used in conjunction with the input/output module 20 of FIG. 1. Generator 30 is comprised of a voltage divider 30a and a control signal generator 30b. Signal generator 30b includes a P-channel transistor 31, an N-channel transistor 32, and a single resistor 33 which are intercoupled in series as shown. In this control signal generator, the N-channel control signal is formed at the drain of transistor 32; while the P-channel control signal is formed at the drain of transistor 31. Voltage divider 30a is the same as the previously described voltage divider 10a, and so its components have like reference numerals.

An equivalent circuit of the reference voltage generator 30, which is similar in form to the FIG. 2 equivalent circuit, is shown in FIG. 5. There, each of the transistors is again represented by a variable resistor having a primed reference numeral which indicates the source-drain resistance of the corresponding transistor with the same number. Each resistor has a tap that moves between a high resistance position and a low resistance position; and the location of the symbols $P_L$, $P_H$, $N_L$, and $N_H$ indicate where the various threshold voltages will position the tap. For example, if the threshold voltage of the P-channel transistors is low in magnitude, then the tap of resistor 31' will be at a low resistance position; and vice versa.

Since the resistors 31' and 32' in the FIG. 5 circuit are in series, the signal NCS will increase or decrease in response to both the N-channel threshold and the P-channel threshold. In particular, signal NCS will be at its lowest voltage when both the N-channel transistors and the P-channel transistors have high magnitude thresholds. That low voltage NCS signal will tend to lower the source-drain resistance of transistor 11; and thus the symbol $P_H N_H$ is shown in FIG. 5 at the low resistance tap position of resistor 11'. Conversely, the symbol $P_L N_L$ is shown at the high resistance position of resistor 11'.

By comparison, signal PCS will have its highest voltage when the P-channel transistors have a low magnitude threshold and the N-channel transistors have a high threshold. Such a high voltage PCS signal will tend to decrease resistor 14'; and thus the symbol $P_L N_H$ is shown at the low resistance tap position of resistor 14'. Conversely, the symbol $P_H N_L$ is shown at the high resistance tap position of resistor 14'.

Considering now FIG. 6, it contains a table which lists various combinations of the threshold voltages for the P-channel and N-channel transistors; and it also lists the resulting resistances 11' and 14' and the resulting reference voltage $V_R$. In the FIG. 6 table, the topmost row gives the typical case since the symbol T is the only entry in that row. Those typical entries can be compared to the entries of the remaining rows.

For example, in the row next to the top, the threshold voltage of the P-channel transistors is typical while the threshold voltage of the N-channel transistors is low. This increases the resistance 11' since the symbol $N_L$ occurs in FIG. 5 at the high resistance position of resistor 11'. Resistance 14' will remain at a typical value since the symbol $N_L$ appears in FIG. 5 at both a low resistance tap position and the high resistance tap position, and so there is a canceling effect.

As another example, consider the FIG. 6 entry in which the threshold voltage of the P-channel transistors is low while the threshold voltage of the N-channel transistors is high. In that case, the resistance 11' will decrease since the symbols $P_L$ and $N_H$ cancel each other on the control signal NCS, and a second $P_L$ symbol is on the low resistance tap. Resistance 14' will remain at about a typical value since the resistance increase which is caused by a high threshold of transistor 14 will be canceled by the high voltage level of the control signal PCS.

As still another example, consider the last entry in the FIG. 6 table in which the threshold of both the P-channel transistors and the N-channel transistors is high. In that case, the resistance 11' will remain at about a typical level since the resistance increase which is caused by the high threshold voltage of transistor 11 will tend to be canceled by the increased voltage of the N-channel control signal. Resistance 14' will increase above the typical value due to the increase in threshold voltage of transistor 14 and the canceling effect of the symbols $N_H$ and $P_H$ in the P-channel control signal.

Figure 7:
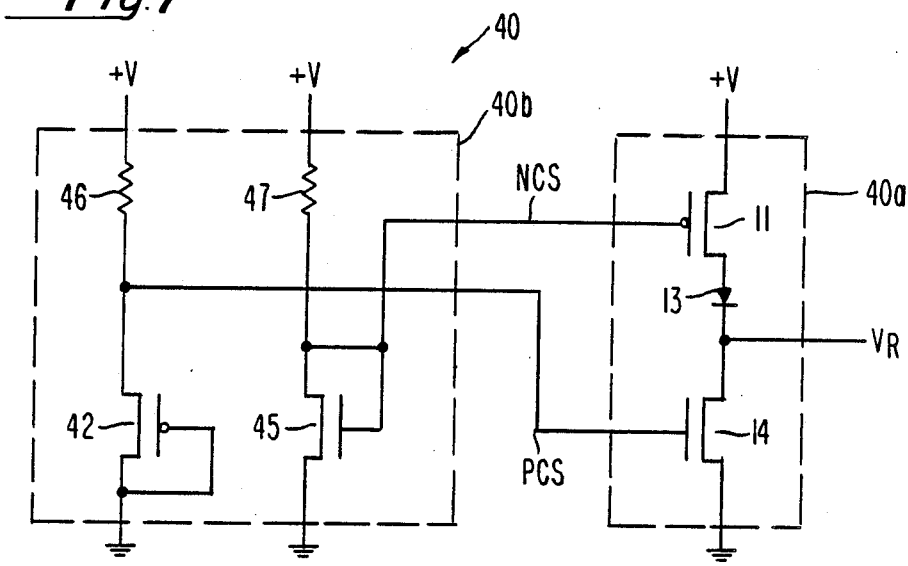
FIG. 7 is a detailed circuit diagram of another preferred embodiment of the invention.
Figure 8:
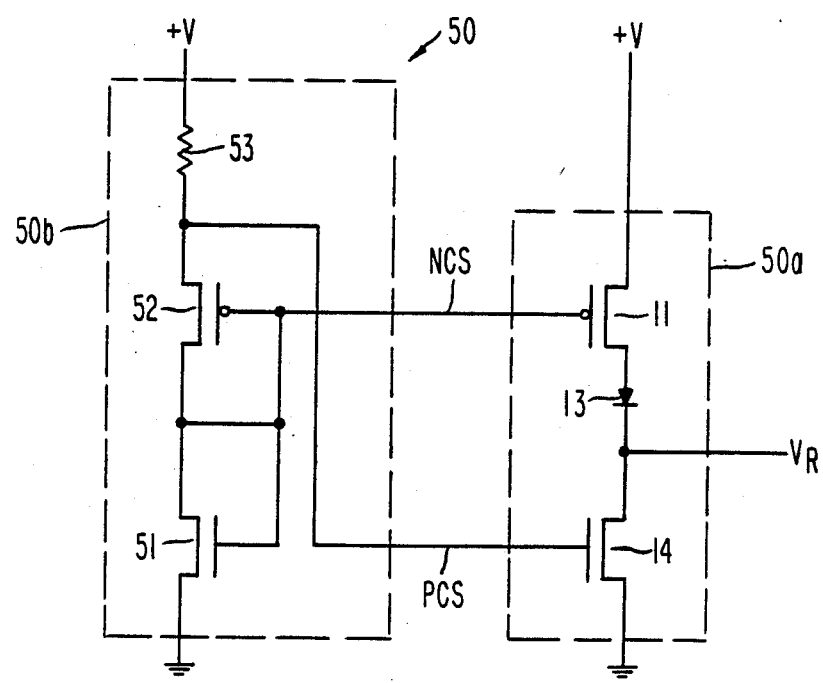
FIG. 8 is a detailed circuit diagram of still another preferred embodiment of the invention.

Two preferred embodiments of the invention have now been described in detail. In addition, however, various changes and modifications can be made to these details without departing from the nature and spirit of the invention. For example, two such modifications are shown in FIGS. 7 and 8. Those figures show reference voltage generators 40 and 50 which produce a variable voltage $V_R$ whose magnitude varies in proportion to the magnitude of the P-channel transistor threshold regardless of how the threshold voltage of the N-channel transistors varies. Thus, the generators 40 and 50 are the complement of the previously described embodiments.

Generator 40 consists of a voltage divider 40a and a control signal generator 40b. Circuit 4a is the same as circuit 10a of FIG. 1. Circuit 40b has the same components as circuit 10b in FIG. 1, but they are interconnected in an inverse fashion. Transistor 42 and resistor 46 of circuit 40b correspond to transistor 12 and resistor 16 of circuit 10b. Transistor 45 and resistor 47 of circuit 40b correspond to transistor 15 and resistor 17 of circuit 10b.

Reference voltage generator 50 consists of a voltage divider 50a and a control signal generator 50b. Circuit 50a is the same as circuit 30a of FIG. 4. Circuit 50b has the same components as circuit 30b of FIG. 3, but they are conneacted in an inverse fashion. Components 51, 52, and 53 in circuit 50b respectively correspond to components 31, 32, and 33 in circuit 30b.

Each of the reference voltage generators of FIGS. 7 and 8 can be used in conjunction with an input/output module, similar to the module 20 of FIG. 1 but in which the output transistor 23 is a P-channel transistor instead of an N-channel transistor. In such an input/output module, the reference voltage will compensate for variations in the output signal voltage which are caused by changes in the threshold voltage of the P-channel output transistor. A P-channel threshold which is large in magnitude will be offset by a reference voltage of increased magnitude; and vice versa.

In view of the above and other similar modifications, it is to be understood that the invention is not limited to the illustrated detailed embodiments but is defined by the appended claims.

What is claimed is:

1. A digital translator on a semiconductor chip that contains N-channel transistors and P-channel transistors which have threshold voltages that vary about respective nominal values; said translator including an input/output module which is made of said transistors and which receives a digital input signal having two input voltage levels and in response generates a digital output signal having two different output voltage levels; wherein to avoid shifts in said output voltage levels due to said threshold variations said translator further includes:

a voltage generator means which produces a reference voltage and sends it to said input/output module;

said generator including a circuit of said N-channel transistors and said P-channel transistors for varying said reference voltage in proportion to the threshold voltage of said N-channel transistors regardless of how the threshold voltage of said P-channel transistors varies;

said input/output module including an output transistor which is one of said N-channel transistors; and, a means for coupling said reference voltage to said output transistor when said input signal is at one of said two input voltage levels and for otherwise coupling a fixed bias voltage thereto;

said output transistor being adapted to produce said output signal by conducting in proportion to said reference voltage when that voltage is received, and by not conducting when said bias voltage is received.

2. A translator according to claim 1 wherein said voltage generator includes:

a voltage divider means, containing one of said P-channel transistors and one of said N-channel transistors that are coupled in series with said reference voltage being produced at their serial coupling; and a control circuit means, that imposes a P-channel control signal on a gate of said N-channel transistor in said voltage divider which increases as the threshold voltage of said P-channel transistors decreases in magnitude, and that imposes an N-channel control signal on a gate of said P-channel transistor in said voltage divider which increases as the threshold voltage of said N-channel transistors decreases.

3. A translator according to claim 2 wherein said control circuit means includes a P-channel transistor and an N-channel transistor which are coupled in parallel through separate resistors at their drain, and which respectively generate said P-channel control signal and said N-channel control signal at their drain.

4. A translator according to claim 2 wherein said control circuit means includes a P-channel transistor, an N-channel transistor and a resistor which are coupled together in series, and which respectively generate said P-channel control signal and said N-channel control signal at their drain.

5. A translator according to claim 2 wherein said N-channel transistor in said input/output module has a gate which is coupled to receive said variable reference voltage through a P-channel transistor that turns on only when said input signal is at said one level.

6. A translator according to claim 5 wherein said voltage divider and said control circuit means are powered between two buses which respectively carry the same voltage levels as said input signal.

7. A digital translator on a semiconductor chip that contain N-channel transistors and P-channel transistors which have threshold voltages that vary about respective nominal values; said translator including an input/output module which is made of said transistors and which receives a digital input signal having two input voltage levels and in response generates a digital output signal having two different output voltage levels; wherein to avoid shifts in said output voltage levels due to said threshold variations said translator further includes:

a voltage generator means which produces a reference voltage and sends it to said input/output module;

said generator including a circuit of said N-channel transistors and said P-channel transistors for varying said reference voltage in inverse proportion to the magnitude of the threshold voltage of said P-channel transistors regardless of how the threshold voltage of said N-channel transistors varies;

said input/output module including an output transistor which is one of said P-channel transistors; and, a means for coupling said reference voltage to said output transistor when said input signal is at one of said two input voltage levels and for otherwise coupling a fixed bias voltage thereto;

said output transistor being adapted to produce said output signal by conducting in proportion to said reference voltage when that voltage is received, and by not conducting when said bias voltage is received.

8. A translator according to claim 7 wherein said voltage generator includes:

a voltage divider means, containing one of said P-channel transistors and one of said N-channel transistors that are coupled in series with said reference voltage being produced at their serial coupling; and a control circuit means, that imposes a P-channel control signal on a gate of said N-channel transistor in said voltage divider which increases as the threshold voltage of said P-channel transistors increases in magnitude, and that imposes an N-channel control signal on a gate of said P-channel transistor in said voltage divider which increases as the threshold voltage of said N-channel transistor increases.

9. A translator according to claim 8 wherein said control circuit means includes a P-channel transistor and an N-channel transistor which are coupled in parallel through separate resistors at their source, and which respectively generate said P-channel control signal and said N-channel control signal at their source.

10. A translator according to claim 8 wherein said control circuit means includes a resistor, a P-channel transistor, and an N-channel transistor which are coupled together in series, and which respectively generate said P-channel control signal and said N-channel control signal at their source.

11. On an integrated circuit chip that contains N-channel transistors and P-channel transistors which have threshold voltages that vary about respective nominal values, a reference voltage generator which is comprised of said transistors and which produces a reference voltage that varies in proportion to the threshold of said N-channel transistors regardless of how the threshold of said P-channel transistors varies; wherein said generator comprises:
   a voltage divider means, containing one of said P-channel transistors and one of said N-channel transistors that are coupled in series with each other;
   a control circuit means, which includes one of said P-channel transistors that generates a P-channel control signal whose magnitude varies in proportion to its threshold voltage, and one of said N-channel transistors that generates an N-channel control signal whose magnitude varies in proportion to its threshold voltage;
   said P-channel transistor of said voltage divider having a gate coupled to receive said N-channel control signal; said N-channel transistor of said voltage divider having a gate coupled to receive said P-channel control signal; and said reference voltage being produced at their serial coupling.

12. On an integrated circuit chip that contains N-channel transistors and P-channel transistors which have threshold voltages that vary about respective nominal values, a reference voltage generator which is comprised of said transistors and which produces a reference voltage that varies in proportion to the threshold of said P-channel transistors regardless of how the threshold of said N-channel transistors varies; wherein said generator comprises:
   a voltage divider means, containing one of said P-channel transistors and one of said N-channel transistors that are coupled in series with each other;
   a control circuit means, which includes one of said P-channel transistors that generates a P-channel control signal whose magnitude varies inversely with its threshold voltage, and one of said N-channel transistors whose magnitude varies directly with its threshold voltage;
   said P-channel transistor of said voltage divider having a gate coupled to receive said N-channel control signal; said N-channel transistor of said voltage divider having a gate coupled to receive said P-channel control signal; and said reference voltage being produced at their serial coupling.

* * * * *